US008878351B2

(12) United States Patent
Suzuki et al.

(10) Patent No.: US 8,878,351 B2
(45) Date of Patent: Nov. 4, 2014

(54) SEMICONDUCTOR DEVICE

(75) Inventors: Eiichi Suzuki, Tokyo (JP); Hideki Osaka, Naka-gun (JP); Yutaka Uematsu, Yokohama (JP); Yoji Nishio, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 683 days.

(21) Appl. No.: 12/318,700

(22) Filed: Jan. 6, 2009

(65) Prior Publication Data

US 2009/0189293 A1 Jul. 30, 2009

(30) Foreign Application Priority Data

Jan. 9, 2008 (JP) ................................ P2008-002536

(51) Int. Cl.
*H01L 23/02* (2006.01)
*H01L 23/50* (2006.01)
*H01L 23/498* (2006.01)
*H01L 25/065* (2006.01)
*H01L 25/18* (2006.01)

(52) U.S. Cl.
CPC ............ *H01L 25/0657* (2013.01); *H01L 25/18* (2013.01); *H01L 2225/06527* (2013.01); *H01L 2924/01055* (2013.01); *H01L 2224/16225* (2013.01); *H01L 2224/16145* (2013.01); *H01L 2225/06517* (2013.01); *H01L 23/50* (2013.01); *H01L 2924/15311* (2013.01); *H01L 2225/06513* (2013.01); *H01L 23/49827* (2013.01); *H01L 23/49838* (2013.01); *H01L 2225/06541* (2013.01)
USPC ......................................... 257/686; 257/777

(58) Field of Classification Search
CPC .............. H01L 25/043; H01L 25/0657; H01L 25/0756; H01L 25/18; H01L 25/50; H01L 23/4012; H01L 23/49838; H01L 23/49827; H01L 2224/16145; H01L 2224/16225; H01L 2225/06513; H01L 2225/06541; H01L 2225/06517; H01L 2225/06527; H01L 2924/15311; H01L 2924/01055
USPC ............... 57/686, 777, E25.006, E25.013, 57/E23.141; 257/686, 685, 678, 700, 777; 438/106
See application file for complete search history.

(56) References Cited

U.S. PATENT DOCUMENTS 5,056,009 A * 10/1991 Mizuta .......................... 711/163
7,123,497 B2 * 10/2006 Matsui et al. ................... 365/51
7,952,184 B2 * 5/2011 Farrar et al. ................... 257/687

(Continued)

FOREIGN PATENT DOCUMENTS

JP 1-95643 4/1989

*Primary Examiner* — Colleen A Matthews
*Assistant Examiner* — Quovaunda V Jefferson
(74) *Attorney, Agent, or Firm* — McGinn IP Law Group, PLLC

(57) ABSTRACT

A semiconductor device having a chip-on-chip structure is constituted of a first semiconductor chip and even-numbered pairs of second semiconductor chips, all of which are laminated together on the surface of an interposer. The first semiconductor chip controls each pair of the second semiconductor chips so as to activate one second semiconductor chip while inactivating another second semiconductor chip. The second semiconductor chips are paired together in such a way that through-vias and electrodes thereof are positioned opposite to each other via bumps. Since drive voltage electrodes supplied with a drive voltage (VDD) and reference potential electrodes supplied with a reference potential (VSS) are mutually connected together between the paired second semiconductor chips, it is possible to increase the overall electrostatic capacitance of each second semiconductor chip so as to substantially reduce feed noise without increasing the overall layout area of the semiconductor device.

21 Claims, 11 Drawing Sheets

(56) References Cited

U.S. PATENT DOCUMENTS

2006/0262587 A1* 11/2006 Matsui et al. ............... 365/63
2007/0158808 A1* 7/2007 Bruce et al. ................ 257/686
2007/0165461 A1* 7/2007 Cornwell et al. ........ 365/185.33
2007/0181991 A1* 8/2007 Ishino et al. ............... 257/686

* cited by examiner (NON-OPERATION MODE)

(OPERATION MODE)

SEMICONDUCTOR DEVICE

BACKGROUND OF THE INVENTION

1. Field of the Invention

The present invention relates to semiconductor devices having chip-on-chip structures for three-dimensionally laminating semiconductor chips via on-chip capacitors. In particular, the present invention relates to techniques for reducing feed noises while increasing on-chip capacitances.

The present application claims priority on Japanese Patent Application No. 2008-2536, the content of which is incorporated herein by reference.

2. Description of Related Art

Semiconductor memories having chip-on-chip (COC) structures have been developed to meet requirements for achieving high performance (e.g. for increasing storage capacities) and for size reduction (e.g. for improving packaging densities).

A typical example of a semiconductor device having a chip-on-chip (COC) structure is designed to laminate a plurality of semiconductor memories (e.g. semiconductor chips serving as dynamic random-access memories) with a controller (i.e. a semiconductor chip for controlling semiconductor memories). The controller is formed in the lowermost layer of the COC structure, while the semiconductor memories are sequentially laminated above the controller. Each of the semiconductor memories has a plurality of through-electrodes.

The controller feeds electric power to each of the semiconductor memories via the through-electrodes which are electrically connected to metal bumps. Electric power is supplied to the semiconductor memories in the order from the lowermost one to the uppermost one.

Various techniques for reducing feed noises in semiconductor devices not having COC structures have been developed and disclosed in various documents such as Patent Document 1, which teaches a semiconductor integrated circuit device having a plurality of operational circuits sharing an external capacitor for the purpose of a reduction of feed noise.

Patent Document 1: Japanese Unexamined Patent Application Publication No. H01-95643

The present inventor has recognized that the above noise reduction technique suffers from the following problem and is not applicable to semiconductor devices having COC structures.

Generally speaking, it is difficult to design semiconductor devices having COC structures in consideration of severe requirements for reducing feed noises, wherein feed noises increase in response to increasing the currents consumed in semiconductor memories, and wherein noise margins decrease in response to decreasing the drive voltages in the recent developments of semiconductor manufacturing processes.

It is possible for semiconductor devices having COC structures to reduce feed noises by use of on-chip capacitors mounted on semiconductor chips laminated together.

Since semiconductor devices having COC structures are designed to feed electric power to semiconductor chips in the order from the lowermost one to the uppermost one, semiconductor chips formed in lower layers have a high priority in feeding electric charge thereto; hence, it is difficult to feed electric charge to semiconductor chips formed in upper layers.

To solve the problem, it is necessary to increase electrostatic capacitances of on-chip capacitors mounted on semiconductor chips; but this increases the overall layout area for mounting semiconductor chips, thus pushing up manufacturing cost.

Because of the above reason, it is necessary to develop a feasible technique for substantially reducing feed noise while increasing electrostatic capacitances of feed lines with low cost and without increasing the overall layout area of semiconductor chips.

SUMMARY

The invention seeks to solve the above problem, or to improve upon the problem at least in part.

In one embodiment, there is provided a semiconductor device that includes a first semiconductor chip and even-numbered pairs of second semiconductor chips laminated above the first semiconductor chip. Herein, the first semiconductor chip includes a first drive voltage electrode supplied with a drive voltage (VDD) and a first reference potential electrode supplied with a reference potential (VSS); the second semiconductor chip includes a second drive voltage electrode supplied with the drive voltage via the first drive voltage electrode and a second reference potential electrode supplied with the reference potential via the first reference potential electrode; and the second semiconductor chip includes a third drive voltage electrode supplied with the drive voltage via the second drive voltage electrode and a third reference potential electrode supplied with the reference potential via the second reference potential electrode. The third drive voltage electrodes of the paired second semiconductor chips are connected together via a first electrode connector, while the third reference potential electrodes of the paired second semiconductor chips are connected together via a second electrode connector. In each pair of the second semiconductor chips, one second semiconductor chip is activated while another second semiconductor chip is inactivated.

In another embodiment of the present invention, there is provided a semiconductor device that includes only the even-numbered pairs of semiconductor chips which are laminated together.

Due to the mutual connection between the third drive voltage electrodes and third reference potential electrodes of the paired second semiconductor chips, the logic circuit of the "inactivated" second semiconductor chip is integrated with the logic circuit of the "activated" second semiconductor chip. That is, the electrostatic capacitance of the logic circuit of the inactivated second semiconductor chip and its surrounding parasitic capacitance collectively serve as a part of the electrostatic capacitance of the logic circuit of the activated second semiconductor chip electrically connected between the drive voltage and the reference potential. This increases the overall electrostatic capacitance so as to cover the electrostatic capacitance of an on-chip capacitor used for absorbing feed noise without increasing the overall layout area for aligning semiconductor chips.

In addition, it is possible to improve the reliability of the semiconductor device by substantially reducing feed noise.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

1. First Embodiment

Figure 1:
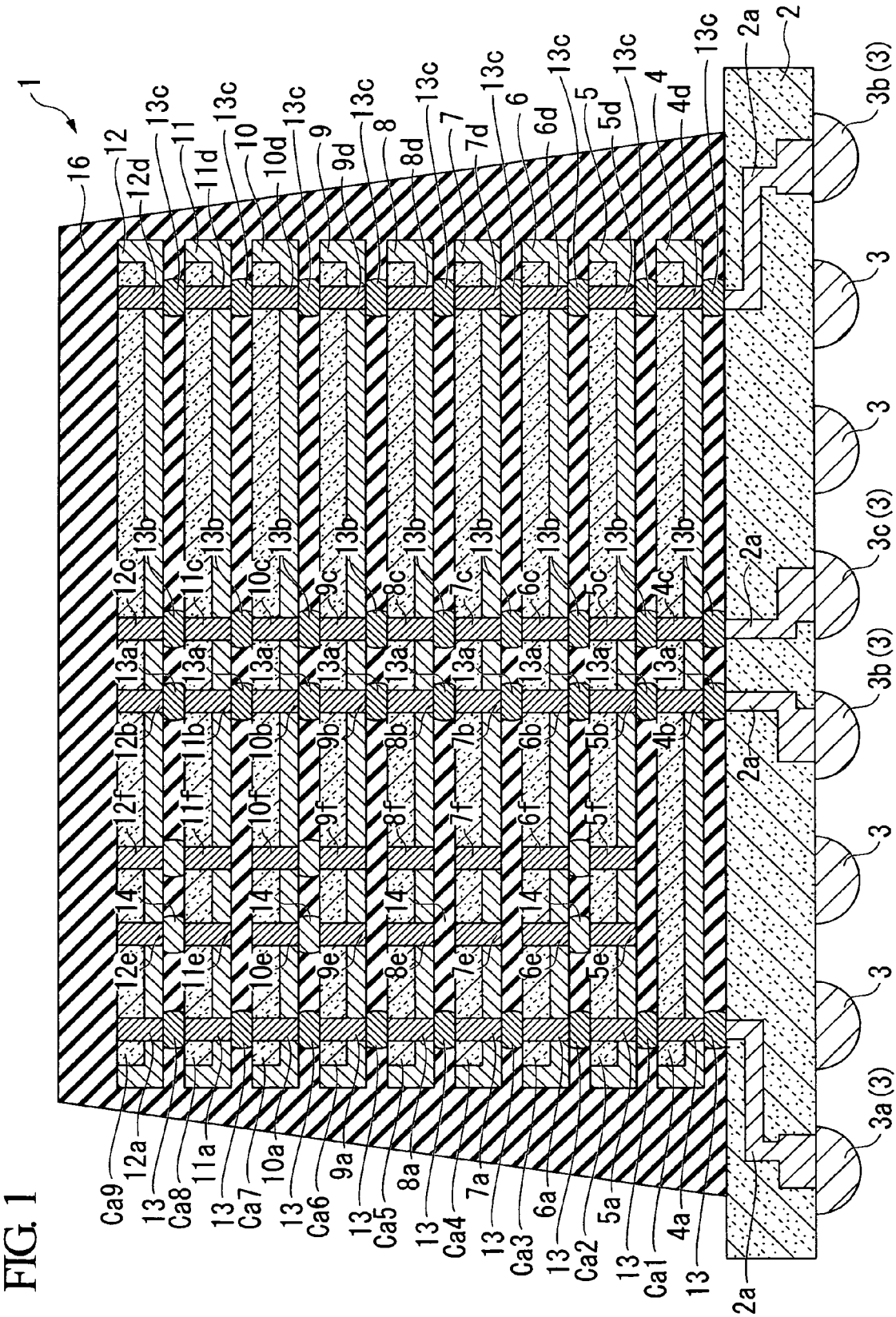
FIG. 1 is a cross-sectional view showing the constitution of a semiconductor device according to a first embodiment of the present invention.
Figure 2:
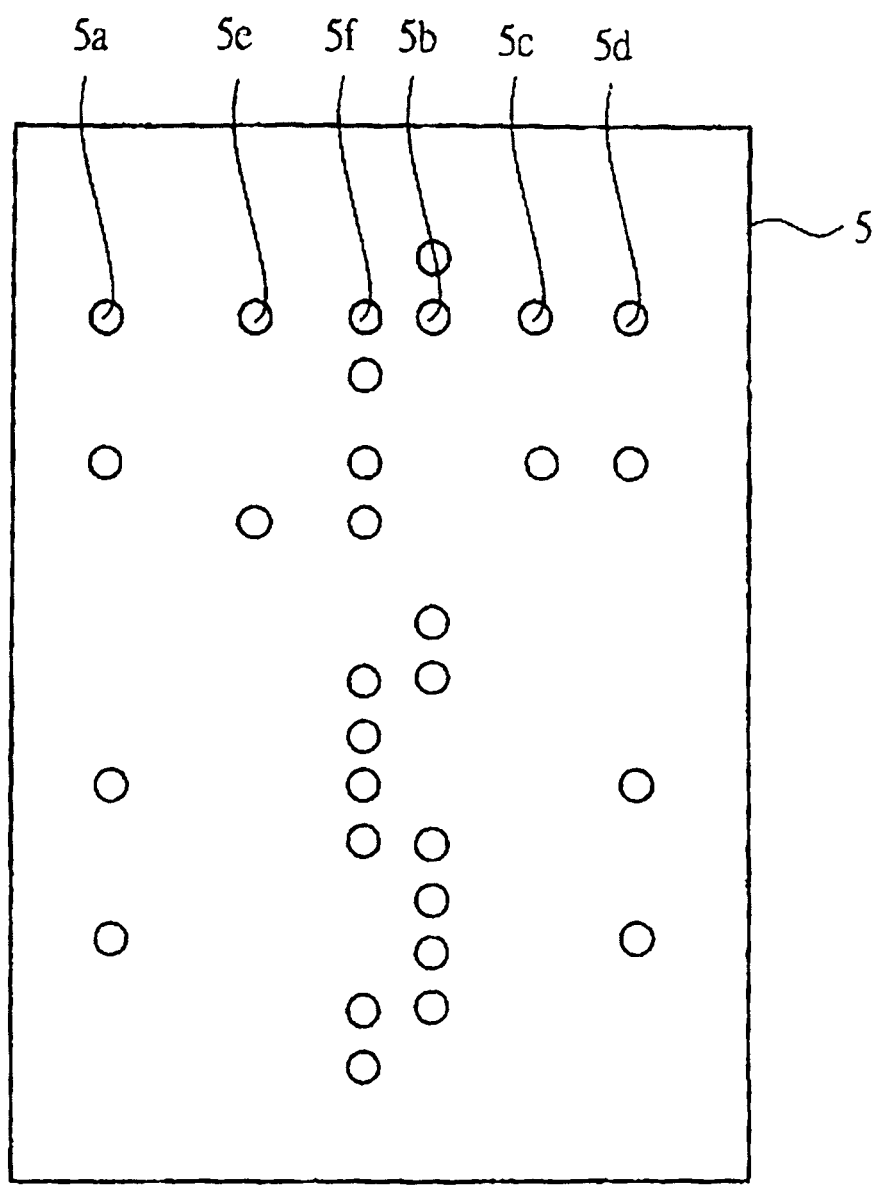
FIG. 2 is a top view of a semiconductor chip included in the semiconductor device.
Figure 3:
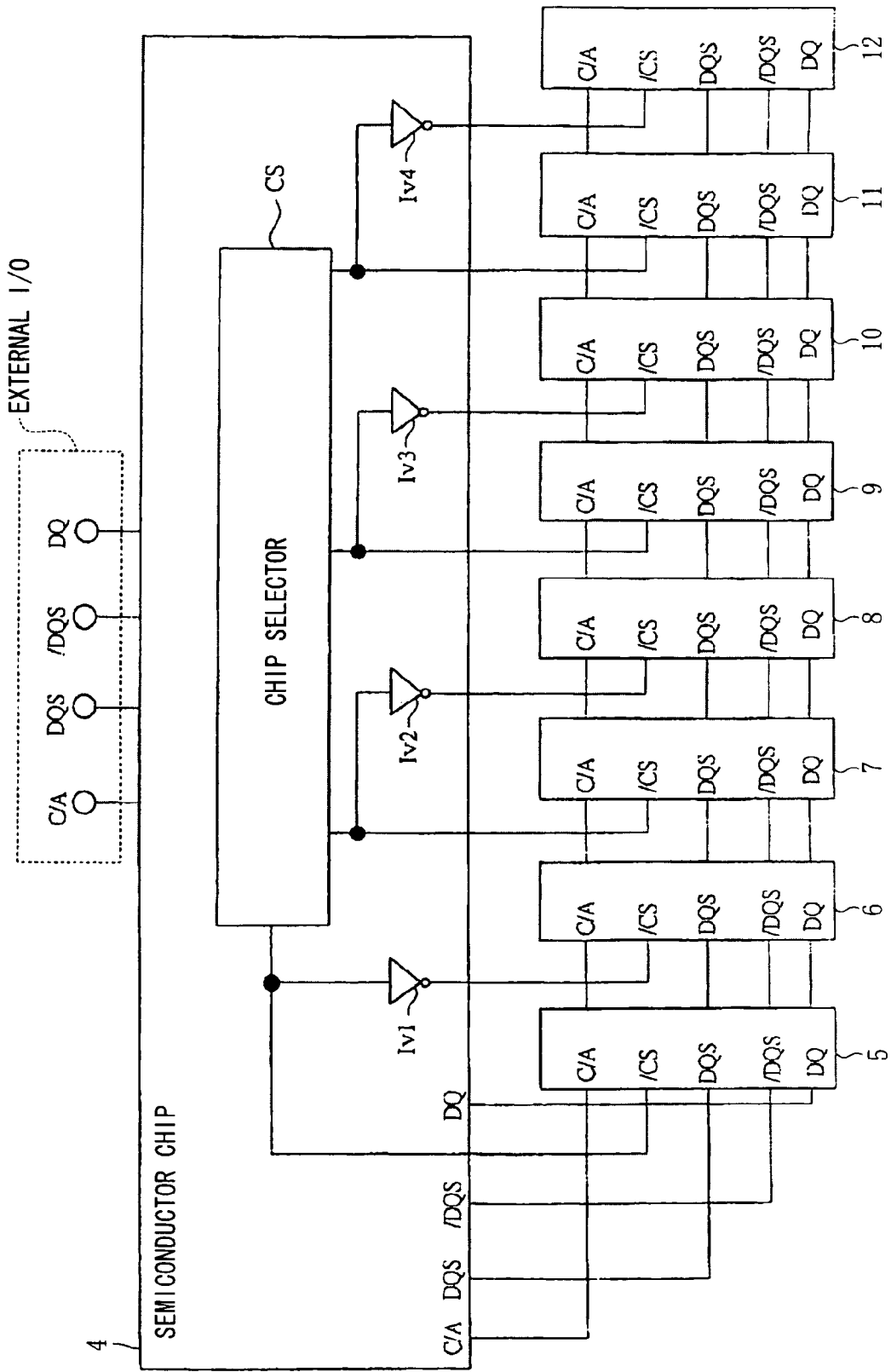
FIG. 3 is a diagram used for explaining a controller selecting semiconductor chips in the semiconductor device.
Figure 4:
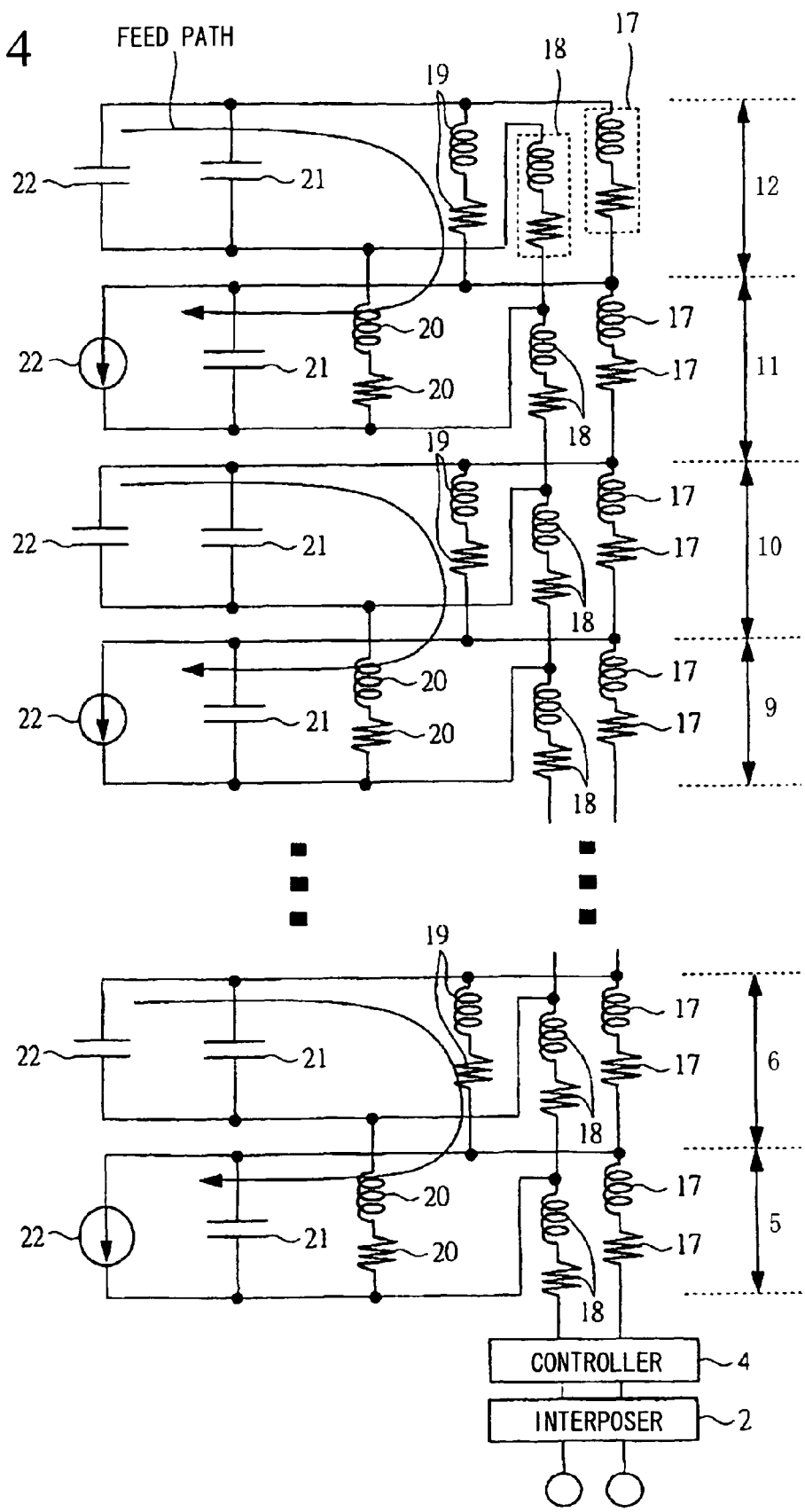
FIG. 4 is a circuit diagram showing a first example of equivalent circuits of semiconductor chips included in the semiconductor device.
Figure 5:
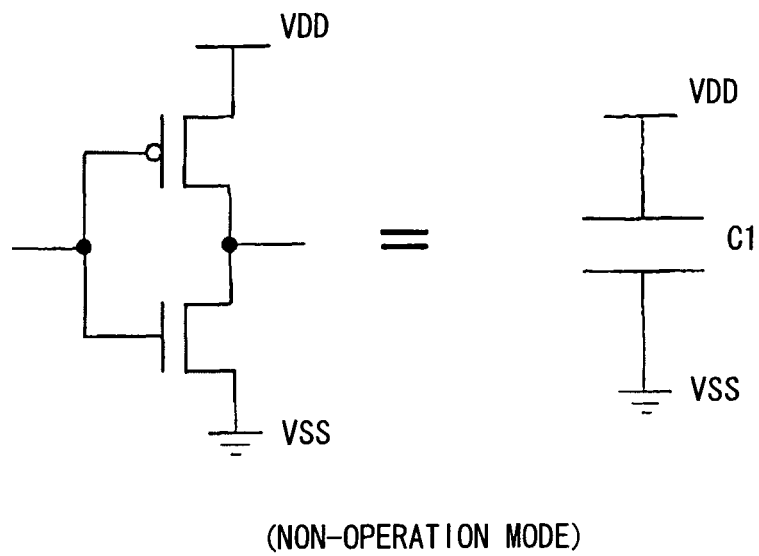
FIG. 5 shows equivalent circuits of a semiconductor chip in a non-operation mode.
Figure 6:
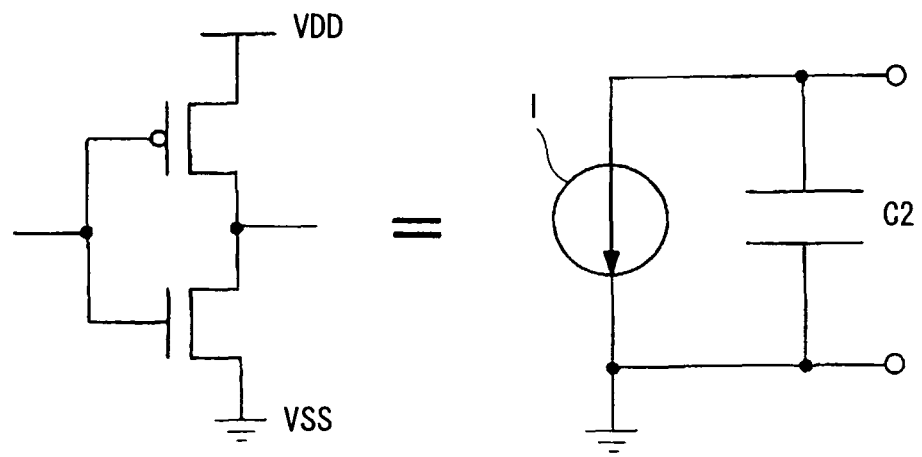
FIG. 6 shows equivalent circuits of a semiconductor chip in an operation mode.
Figure 7:
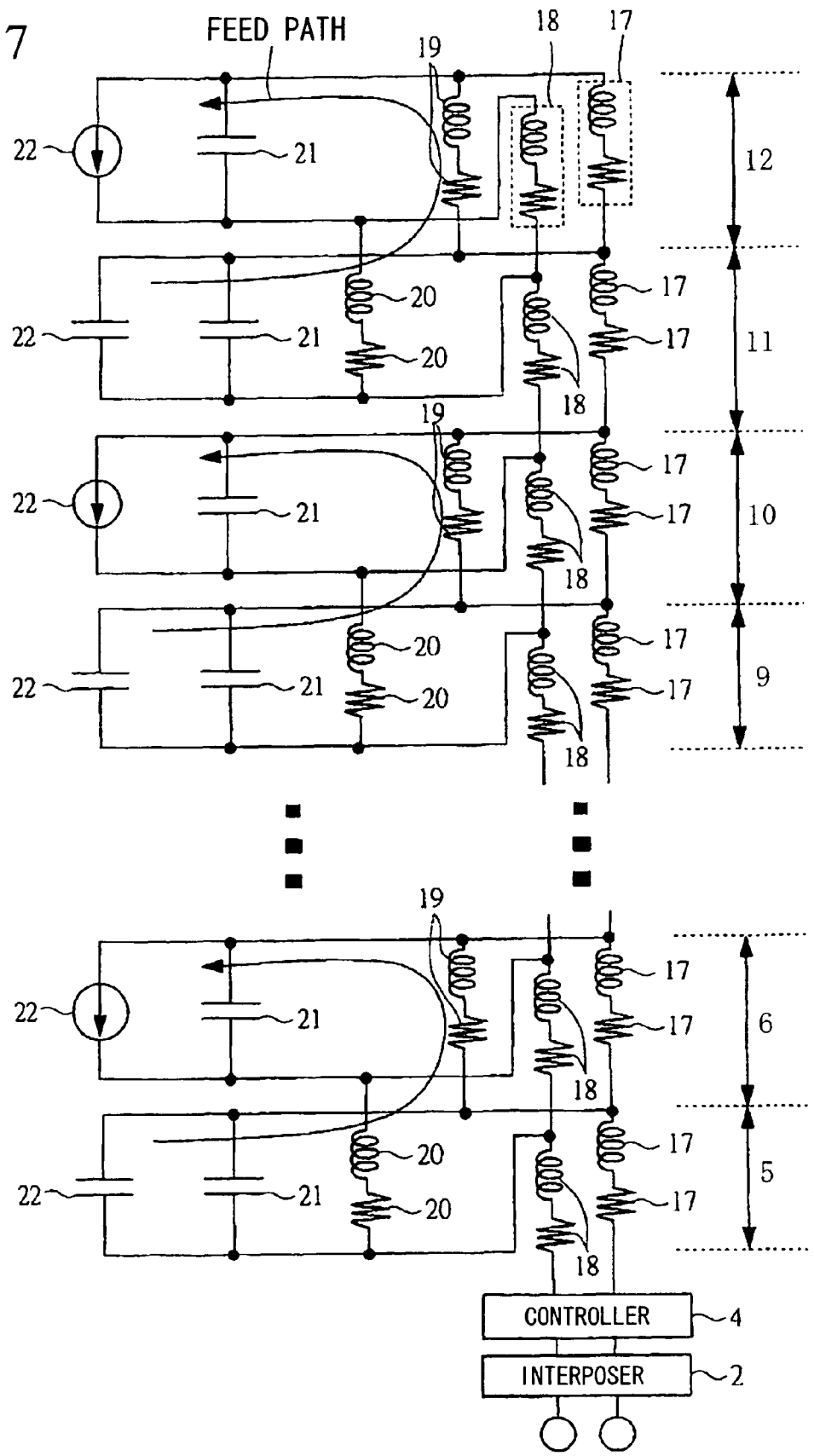
FIG. 7 is a circuit diagram showing a second example of equivalent circuits of semiconductor chips included in the semiconductor device.

FIG. 1 is a cross-sectional view of a semiconductor device 1 according to a first embodiment of the present invention. FIG. 2 is a top view of a semiconductor chip used in the semiconductor device 1. FIG. 3 is a diagram used for explaining a controller selecting semiconductor chips included in the semiconductor device 1. FIG. 4 is a circuit diagram showing a first example of equivalent circuits of semiconductor chips included in the semiconductor device 1. FIG. 5 shows equivalent circuits of a semiconductor chip whose logic circuit does not operate. FIG. 6 shows equivalent circuits of a semiconductor chip whose logic circuit does not operate. FIG. 7 is a circuit diagram showing a second example of equivalent circuits of semiconductor chips included in the semiconductor device 1.

As shown in FIG. 1, the semiconductor 1 having a chip-on-chip (COC) structure is equipped with an interposer 2 (serving as a wiring substrate) having a plurality of connection electrodes 3 aligned in an array on the backside thereof.

A plurality of semiconductor chips (i.e. nine semiconductor chips) 4 to 12 is sequentially deposited and laminated on the surface of the interposer 2, thus forming the COC structure.

The semiconductor chip 4 serves as a controller for controlling the semiconductor chips 5 to 12, which are configured of volatile semiconductor memories such as dynamic random-access memories (DRAM). Specifically, the semiconductor chip 4 has a control unit for reading, writing, and erasing data and an interface unit for inputting and outputting signals in connection with the semiconductor chips 5 to 12.

A plurality of electrodes is formed on the surface (serving as a chip mounting surface) of the interposer 2 and is aligned from left to right in FIG. 1. These electrodes are connected to connection electrodes 3a to 3d (included in the connection electrodes 3) formed on the backside of the interposer 2 via wires 2a.

The connection electrodes 3a and 3d are used to input and output signals; the connection electrode 3b is connected with a drive voltage VDD; and the connection electrode 3c is connected with a reference potential VSS.

The semiconductor chips 4 to 12 are laminated and mounted on circuit fabrication regions Ca1 to Ca9 corresponding to the surfaces thereof.

The semiconductor chip 4 has a through-via 4a, a through-via (serving as a first drive voltage electrode) 4b, a through-via (serving as a first reference potential electrode) 4c, and a through-via 4d, which are formed at prescribed positioned aligned in the direction from the left to the right in FIG. 1.

In connection with the through-vias 4a to 4d formed in the semiconductor chip 4, through-vias 5a-5d, 6a-6d, 7a-7d, 8a-8d, 9a-9d, 10a-10d, 11a-11d, and 12a-12d are formed at the prescribed positions of the semiconductor chips 5, 6, 7, 8, 9, 10, 11, and 12 and are respectively aligned from left to right in FIG. 1.

The through-vias 5b, 6b, 7b, 8b, 9b, 10b, 11b, and 12b serve as second drive voltage electrodes, while the through-vias 5c, 6, 7c, 8c, 9c, 10c, 11c, and 12c serve as second reference potential electrodes.

In addition, through-vias 5e, 6e, 7e, 8e, 9e, 10e, 11e, and 12e (serving as third drive voltage electrodes) are formed at the prescribed positions of the semiconductor chips 5, 6, 7, 8, 9, 10, 11, and 12. Furthermore, through-vias 5f, 6f, 7f, 8f, 9f, 10f, 11f, and 12f (serving as third reference potential electrodes) are formed at the prescribed positions of the semiconductor chips 5, 6, 7, 8, 9, 10, 11, and 12.

The aforementioned through-vias 4a-4d, 5a-5d, 6a-6d, 7a-7d, 8a-8d, 9a-9d, 10a-10d, 11a-11d, and 12a-12d are through-holes running through the semiconductor chips 4, 5, 6, 7, 8, 9, 10, 11, and 12 between their surfaces and backsides.

The through-vias 4a, 5a, 6a, 7a, 8a, 9a, 10a, 11a, and 12a are connected to a first electrode formed on the surface of the interposer 2 via bumps 13.

The through-vias 4b, 5b, 6b, 7b, 8b, 9b, 10b, 11b, and 12b are connected to a second electrode formed on the surface of the interposer 2 via bumps 13a.

The through-vias 4c, 5c, 6c, 7c, 8c, 9c, 10c, 11c, and 12c are connected to a third electrode formed on the surface of the interposer 2 via bumps 13b.

The through-vias 4d, 5d, 6d, 7d, 8d, 9d, 10d, 11d, and 12d are connected to a fourth electrode formed on the surface of the interposer 2 via bumps 13c.

The through-vias 4a to 12a are connected together and aligned linearly from the lower section to the upper section in FIG. 1. Similarly, the through-vias 4b to 12b are connected together and aligned linearly from the lower section to the upper section in FIG. 1. The through-vias 4c to 12c are connected together and aligned linearly from the lower section to the upper section in FIG. 1. The through-vias 4d to 12d are connected together and aligned linearly from the lower section to the upper section in FIG. 1.

The through-vias 4b to 12b are connected to feed lines (for supplying the drive voltage VDD) formed in wiring layers which are formed in the circuit fabrication regions Ca1 to Ca9 (corresponding to the surfaces of the semiconductor chips 4 to 12). The feed lines are used to supply the drive voltage VDD to logic circuits formed in the circuit fabrication regions Ca1 to Ca9 of the semiconductor chips 4 to 12.

The through-vias 4c to 12c are connected to reference lines (connected with the reference potential VSS) formed in the wiring layers of the semiconductor chips 4 to 12. The reference lines connect the reference potential VSS to the logic circuits formed in the circuit fabrication regions Ca1 to Ca9 of the semiconductor chips 4 to 12.

Thus, electric power is supplied to the semiconductor chips 4 to 12 from the interposer 2 by way of the through-vias 4b to 12b and the through-vias 4c to 12c via the feed lines and the reference lines.

In FIG. 1, a pair of the through-vias 5e and 5f is formed in the right side of the through-via 5a of the semiconductor chip 5. Similarly, a pair of the through-vias 6e and 6f is formed in the right side of the through-via 6a of the semiconductor chip 6. A pair of the through-vias 7e and 7f is formed in the right side of the through-via 7a of the semiconductor chip 7. A pair of the through-vias 8e and 8f is formed in the right side of the through-via 8a of the semiconductor chip 8. A pair of the through-vias 9e and 9f is formed in the right side of the through-via 9a of the semiconductor chip 9. A pair of the through-vias 10e and 10f is formed in the right side of the through-via 10a of the semiconductor chip 10. A pair of the through-vias 11e and 11f is formed in the right side of the through-via 11a of the semiconductor chip 11. A pair of the through-vias 12e and 12f is formed in the right side of the through-via 12a of the semiconductor chip 12.

The through-vias 5e and 6e are connected together via a bump 14; the through-vias 7e and 8e are connected together via a bump 14; the through-vias 9e and 10e are connected together via a bump 14; and the through-vias 11e and 12e are connected together via a bump 14. The bumps 14 serve as first electrode connectors.

The through-vias 5f and 6f are connected together via a bump 15; the through-vias 7f and 8f are connected together via a bump 15; the through-vias 9f and 10f are connected together via a bump 15; and the through-vias 11f and 12f are connected together via a bump 15. The bumps 15 serve as second electrode connectors.

The through-vias 5e to 12e are connected to the feed lines (for supplying the drive voltage VDD) formed in the wiring layers of the semiconductor chips 5 to 12. The through-vias 5f to 12f are connected to the reference lines (connected with the reference potential VSS) used in the wiring layers of the semiconductor chips 5 to 12.

The semiconductor device 1 of the first embodiment is characterized in that the adjacently laminated semiconductor chips are paired together via the bumps 14 and 15. Due to the paired connection of the adjacent semiconductor chips 5 and 6, for example, a logic circuit (e.g. a memory circuit) of the semiconductor chip 5 formed in proximity to the through-vias 5e and 5f is electrically connected to a logic circuit of the semiconductor chip 6 formed in proximity to the through-vias 6e and 6f via the feed lines aligned relative to the circuit fabrication region Ca2.

The surface of the interposer 2 and the semiconductor chips 4 to 12 are sealed with a resin mold, thus forming a package 16 encapsulating the semiconductor chip 1.

FIG. 2 is a top view showing the surface of the semiconductor chip 5.

The semiconductor chip 5 has the through-via 5a connected with a signal line, which is formed in the upper-leftmost portion in FIG. 2. The through-via 5e connected with a feed line is formed in the right side of the through-via 5a.

The through-via 5f connected with a reference line is formed in the right of the through-via 5f. The through-via 5b is formed in the right side of the through-via 5f so as to supply the drive voltage VDD, which is supplied from an external device (not shown) via the interposer 2, to the semiconductor chip 6 deposited above the semiconductor chip 5.

The through-via 5c is formed in the right side of the through-via 5b so as to connect the reference potential VSS, which is given from the external device via the interposer 2, to the semiconductor chip 6 deposited above the semiconductor chip 5. The through-via 5d connected with a signal line is formed in the right side of the through-via 5c.

Similar to the through-vias 5a to 5f aligned at the prescribed positions of the semiconductor chip 5, the through-vias 6a-6f, 7a-7f, 8a-8f, 9a-9f, 10a-10f, 11a-11f, and 12a-12f are aligned at the prescribed positions of the semiconductor chips 6, 7, 8, 9, 10, 11, and 12. The semiconductor chip 4 is configured similarly to the semiconductor chips 5 to 12 except that it has no through-via corresponding to the through-vias 5e and 5f.

The semiconductor chips 5 to 12 are subdivided into four pairs, i.e. a pair of the semiconductor chips 5 and 6, a pair of the semiconductor chips 7 and 8, a pair of the semiconductor chips 9 and 10, and a pair of the semiconductor chips 11 and 12, wherein the paired semiconductor chips are controlled so as not to operate simultaneously.

In other words, the through-vias 5e and 5f of the semiconductor chip 5 are paired with the through-vias 6e and 6f of the semiconductor chip 6 via the bumps 14 and 15. Similarly, the through-vias 7e and 7f of the semiconductor chip 7 are paired with the through-vias 8e and 8f of the semiconductor chip 8 via the bumps 14 and 15. The through-vias 9e and 9f of the semiconductor chip 9 are paired with the through-vias 10e and 10f the semiconductor chip 10 via the bumps 14 and 15. The through-vias 11e and 11f of the semiconductor chip 11 are paired with the through-vias 12e and 12f of the semiconductor chip 12 via the bumps 14 and 15.

FIG. 3 shows the semiconductor chip 4 serving as the controller for selecting the semiconductor chips 5 to 12.

The control section of the semiconductor chip 4 has a chip selector CS, which output chip-select signals to the semiconductor chips 5 to 12, which are thus arbitrarily selected.

Specifically, the chip selector CS outputs four chip-select signals directly to chip-select terminals "/CS" of the semiconductor chips 5, 7, 9, and 11, wherein the chip-select signals are supplied to chip-select terminals "/CS" of the semiconductor chips 6, 8, 10, and 12 (which are paired with the semiconductor chips 5, 7, 9, and 11) via inverters Iv1, Iv2, Iv3, and Iv4.

The chip selector CS asserts chip-select signals at low levels so as to activate the corresponding semiconductor chips, while the chip selector CS negates chip-select signals at high levels so as to inactivate the corresponding semiconductor chips.

Since chip-select signals are supplied to the chip-select terminals/CS of the semiconductor chips 6, 8, 10, and 12 via the inverters Iv1, Iv2, Iv3, and Iv4, they are inactivated when the paired semiconductor chips 5, 7, 9, and 11 are activated. Alternatively, the semiconductor chips 6, 8, 10, and 12 are activated when the paired semiconductor chips 5, 7, 9, and 11 are inactivated.

Next, the operation of the semiconductor device 1 will be described with reference to FIGS. 4 to 7.

FIG. 4 is a circuit diagram showing a first example of the equivalent circuits of the semiconductor chips 5 to 12, wherein the semiconductor chips 5, 7, 9, and 11 are activated while the semiconductor chips 6, 8, 10, and 12 are inactivated.

In FIG. 4, reference numerals 17 designate equivalent models (i.e. series circuits constituted of inductors and resistors) representing the through-vias 5b, 6b, 7b, 8b, 9b, 10b, 11b, and 12b of the semiconductor chips 5 to 12, and reference numerals 18 designate equivalent models (i.e. series circuits constituted of inductors and resistors) representing the through-holes 5c, 6c, 7c, 8c, 9c, 10c, 11c, and 12c of the semiconductor chips 5 to 12.

Reference numerals 19 designate equivalent models (i.e. series circuits constituted of inductors and resistors) representing a pair of the through-vias 5e and 6e of the semiconductor chips 5 and 6, a pair of the through-vias 7e and 8e of the semiconductor chips 7 and 8, a pair of the through-vias 9e and 10e of the semiconductor chips 9 and 10, and a pair of the through-vias 11e and 12e of the semiconductor chips 11 and 12.

Reference numerals 20 designate equivalent models (i.e. series circuits constituted of inductors and resistors) representing a pair of the through-vias 5f and 6f of the semiconductor chips 5 and 6, a pair of the through-vias 7f and 8f of the semiconductor chips 7 and 8, a pair of the through-vias 9f and 10f the semiconductor chips 9 and 10, and a pair of the through-vias 11f and 12f of the semiconductor chips 11 and 12.

Reference numerals 21 and 22 designate equivalent models of the logic circuits of the semiconductor chips 5 to 12.

An example of the logic circuit is constituted of a pair of transistors as show in FIGS. 5 and 6, wherein FIG. 5 shows an equivalent model of the logic circuit which is represented by an electrostatic capacitance C1 in a non-operation mode, while FIG. 6 shows an equivalent model of the logic circuit which is represented by an electrostatic capacitance C2 and a constant current source I in an operation mode.

The equivalent models 21 may further include parasitic capacitances (such as wiring capacitances) and electrostatic capacitances of on-chip capacitors for stabilizing electric voltages supplied to the semiconductor chips 5 to 12 in addition to the electrostatic capacitances of the logic circuits. The electrostatic capacitances included in the equivalent models 21 and 22 indicate on-chip capacitances of the semiconductor chips 5 to 12.

FIG. 4 shows that the semiconductor chips 5, 7, 9, and 11 are activated so as to possess the on-chip capacitances (or electrostatic capacitances) of the equivalent models 21 and 22 of the "inactivated" semiconductor chips 6, 8, 10, and 12.

For example, the electrostatic capacitances of the equivalent models 21 and 22 of the "inactivated" semiconductor chip 6 paired with the "activated" semiconductor chip 5 are added to the equivalent model 21 of the semiconductor chip 5, thus increasing the overall electrostatic capacitance of the semiconductor chip 6.

Similarly, the electrostatic capacitances of the equivalent models 21 and 22 of the "inactivated" semiconductor chips 8, 10, and 12 paired with the "activated" semiconductor chips 7, 9, and 11 are respectively added to the equivalent models 21 of the semiconductor chips 7, 9, and 11, thus increasing the overall electrostatic capacitances of the semiconductor chips 7, 9, and 11.

FIG. 7 shows a second example of the equivalent circuits of the semiconductor chips 5 to 12 included in the semiconductor device 1, wherein the semiconductor chips 5, 7, 9, and 11 are inactivated while the semiconductor chips 6, 8, 10, and 12 are activated.

FIG. 7 shows that the "activated" semiconductor chips 6, 8, 10, and 12 possess the electrostatic capacitances of the equivalent models 21 and 22 of the "inactivated" semiconductor chips 5, 7, 9, and 11.

Specifically, the electrostatic capacitances of the equivalent models 21 and 22 of the "inactivated" semiconductor chip 5 paired with the "activated" semiconductor chip 6 are added to the equivalent model 21 of the semiconductor chip 6, thus increasing the overall electrostatic capacitance of the semiconductor chip 6.

Similarly, the electrostatic capacitances of the equivalent models 21 and 22 of the "inactivated" semiconductor chips 7, 9, and 11 are added to the equivalent models 21 of the "activated" semiconductor chips 8, 10, and 12, thus increasing the overall electrostatic capacitances of the semiconductor chips 8, 10, and 12.

In order to stabilize the feed lines of the logic circuits and memories and, in particular, to absorb feed noise, it is preferable that capacitors be positioned in proximity to the logic circuits and memories. Even when large-capacity capacitors are externally added to semiconductor chips, it is effective to use on-chip capacitors for the purpose of feed noise reduction.

The first embodiment is designed to increase the electrostatic capacitances at prescribed positions proximate to the logic circuits, at which on-chip capacitors must be positioned between the drive voltage VDD and the reference potential VSS. Thus, the first embodiment can substantially reduce noises of feed lines and effectively operates to supply the stabilized drive voltage to the logic circuit and memories.

Since the first embodiment eliminates the necessity of adding large-capacity on-chip capacitors to the semiconductor chips 5 to 12, it is possible to reduce the overall layout area of the semiconductor chips 5 to 12, thus reducing the manufacturing cost.

2. Second Embodiment

Next, a semiconductor device 100 according to a second embodiment of the present invention will be described with reference to FIGS. 8 to 12, wherein parts identical to those of the semiconductor device 1 are designated by the same reference numerals; hence, the duplicate descriptions thereof are simplified or omitted.

Figure 8:
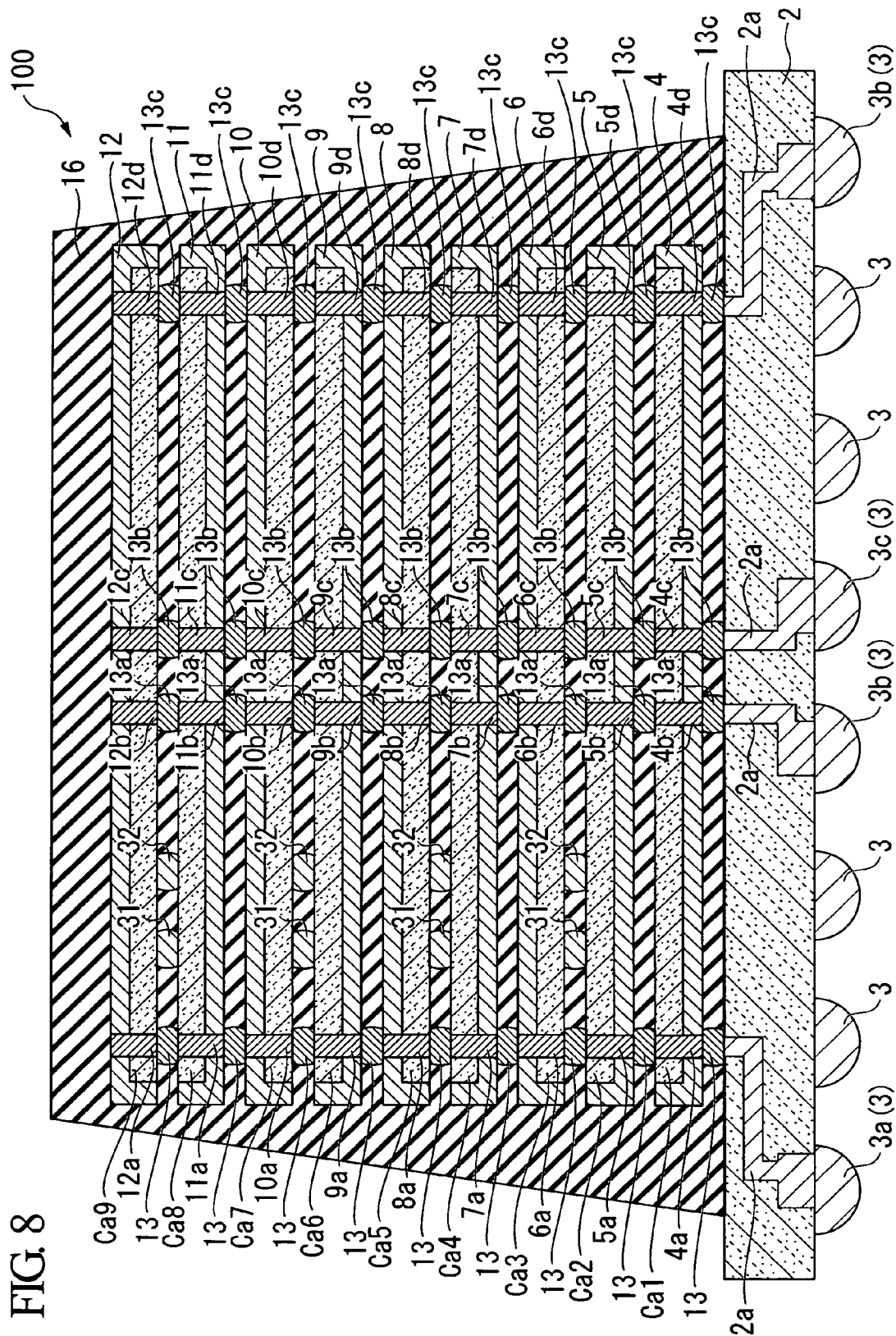
FIG. 8 is a cross-sectional view showing the constitution of a semiconductor device according to a second embodiment of the present invention.
Figure 9:
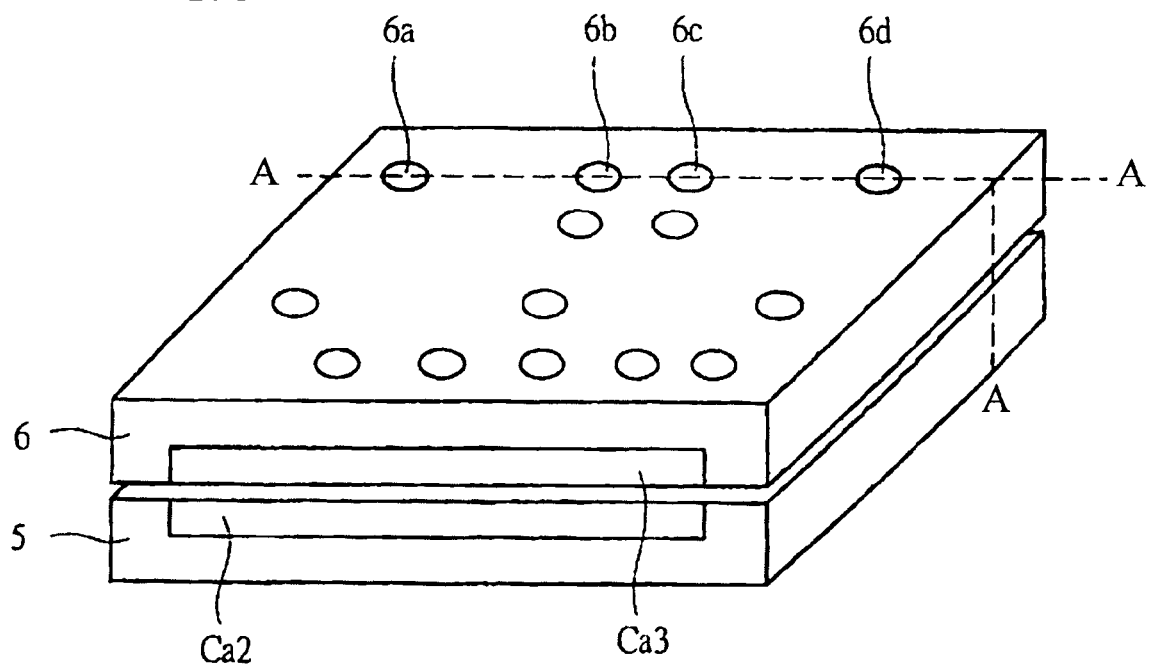
FIG. 9 is a perspective view showing the laminated structure of semiconductor chips included in the semiconductor device.
Figure 10:
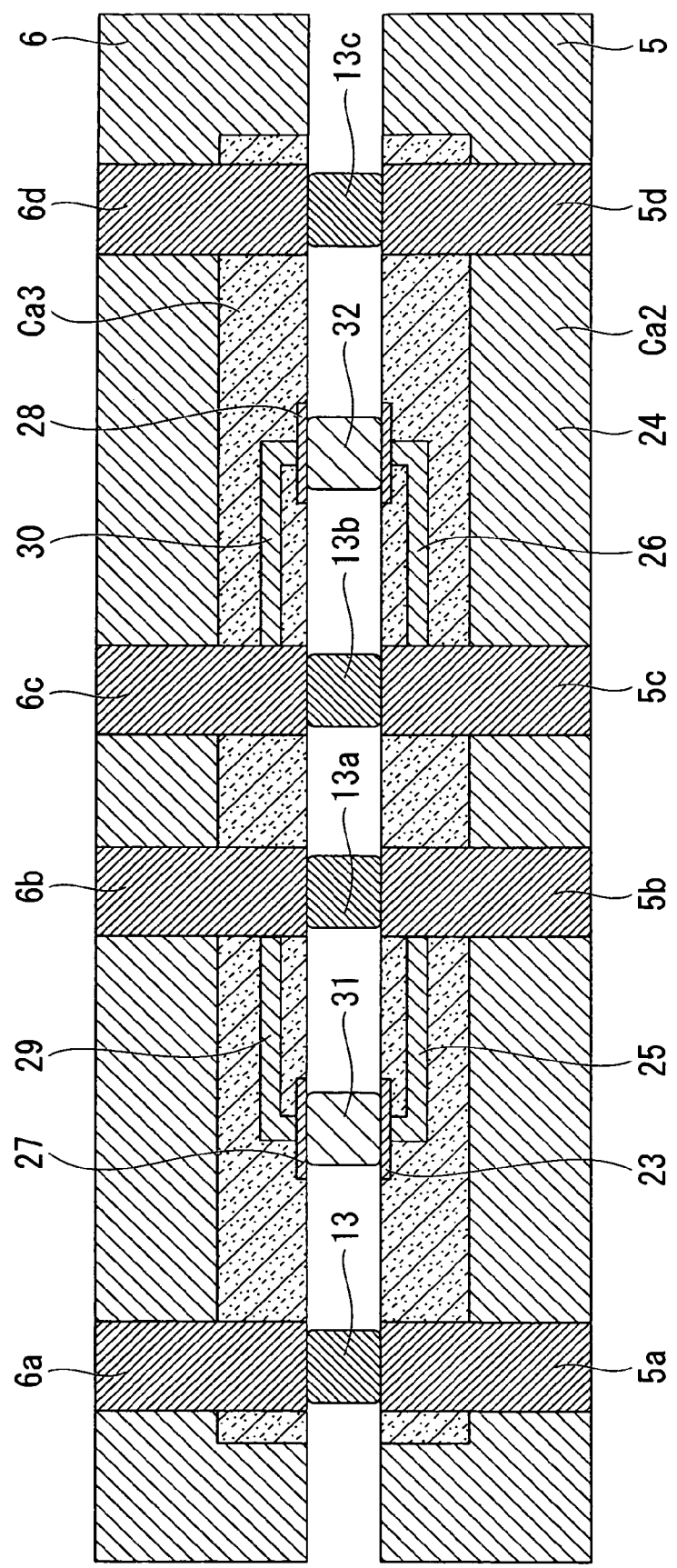
FIG. 10 is a cross-sectional view taken along line A-A in FIG. 9.
Figure 11:
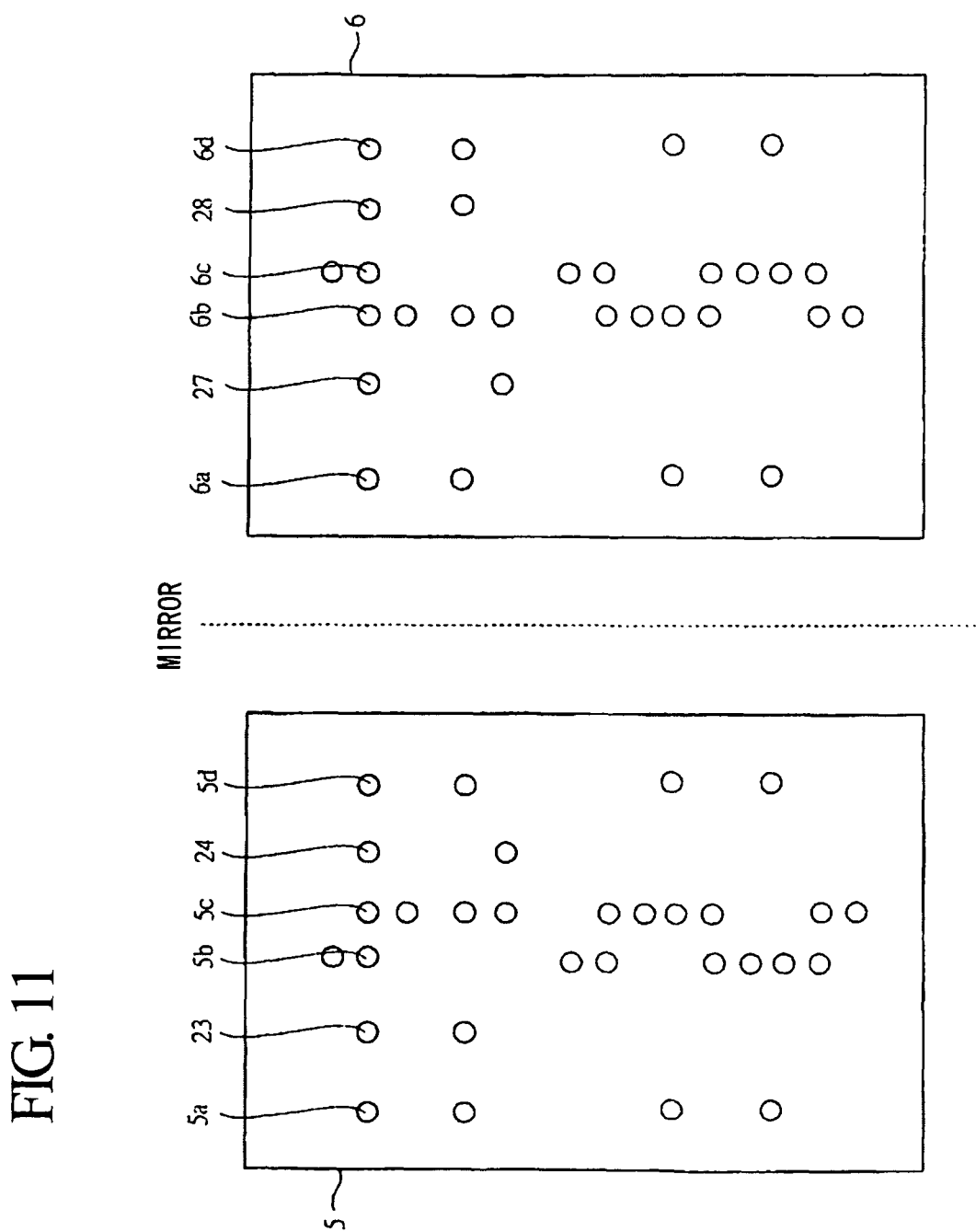
FIG. 11 is a top view showing a first example of the layout for aligning through-vias and electrodes in the paired semiconductor chips.
Figure 12:
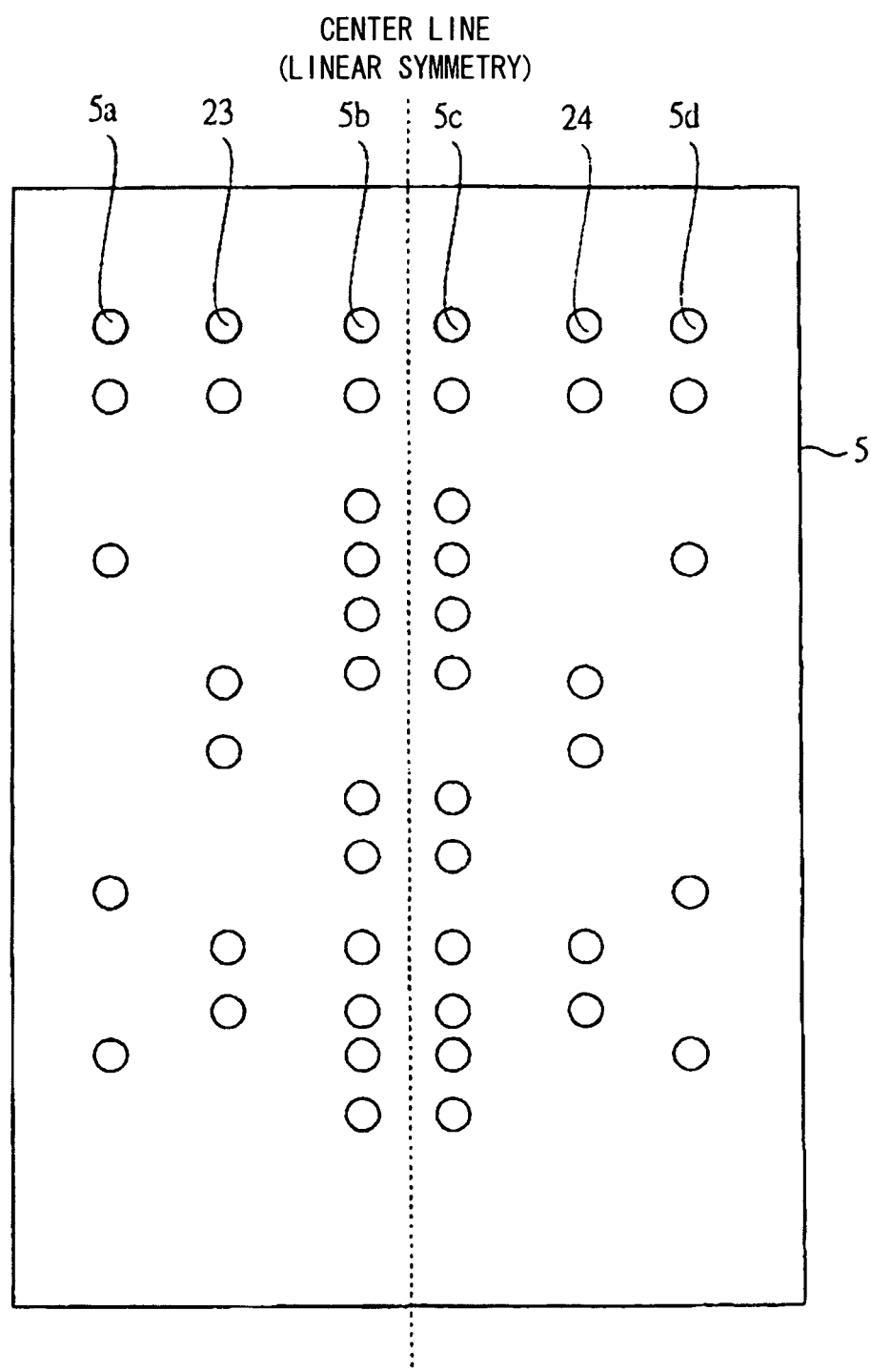
FIG. 12 is a top view showing a second example of the layout for aligning through-vias and electrodes in the semiconductor chip.

FIG. 8 is a cross-sectional view of the semiconductor device 100 according to the second embodiment of the present invention. FIG. 9 is a perspective view showing the laminated structure of the semiconductor chips 5 and 6 in the semiconductor device 100. FIG. 10 is a cross-sectional view taken along line A-A in FIG. 9. FIG. 11 is top view showing a first example of fabrication of through-vias and electrodes in the semiconductor chips 5 and 6. FIG. 12 is a top view showing a second example of fabrication of through-vias and electrodes in the semiconductor chip 5.

The semiconductor device 100 of the second embodiment is designed in a similar way as the semiconductor device 1 of the first embodiment so as to have the COC structure in which the semiconductor chips 4 to 12 are deposited and laminated on the interposer 2.

The second embodiment differs from the first embodiment in terms of the laminated structures adapted to the paired semiconductor chips 5 and 6, the paired semiconductor chips 7 and 8, the paired semiconductor chips 9 and 10, and the paired semiconductor chips 11 and 12.

As shown in FIG. 8, the circuit fabrication region Ca2 of the semiconductor chip 5 is positioned opposite to the circuit fabrication region Ca3 of the semiconductor chip 6; the circuit fabrication region Ca4 of the semiconductor chip 7 is positioned opposite to the circuit fabrication region Ca5 of the semiconductor chip 8; the circuit fabrication region Ca6 of the semiconductor chip 9 is positioned opposite to the circuit fabrication region Ca7 of the semiconductor chip 10; and the circuit fabrication region Ca8 of the semiconductor chip 11 is positioned opposite to the circuit fabrication region Ca9 of the semiconductor chip 12.

For example, the semiconductor chips 5 and 6 are paired as shown in FIG. 9 in which the circuit fabrication region Ca2 is positioned opposite to the circuit fabrication region Ca3.

The laminated structure adapted to the semiconductor chips 5 and 6 will be described in further detail in conjunction with FIG. 10, which is a cross-sectional view taken along line A-A in FIG. 9.

An electrode 23 is located between the through-vias 5a and 5b and is exposed on the surface of the circuit fabrication region Ca2 of the semiconductor chip 5, while an electrode 24 is located between the through-vias 5c and 5d and is exposed on the surface of the circuit fabrication region Ca2 of the semiconductor chip 5.

The electrode 23 is connected to the through-via 5b via a wire 25 formed in the wiring layer of the circuit fabrication region Ca2, while the electrode 24 is connected to the through-via 5c via a wire 26 formed in the wiring layer of the circuit fabrication region C2a.

Similarly, an electrode 27 is located between the through-vias 6a and 6b and is exposed on the surface of the circuit fabrication region Ca3 of the semiconductor chip 6, while an electrode 28 is located between the through-vias 6c and 6d and is exposed on the surface of the circuit fabrication region Ca3 of the semiconductor chip 6.

The electrode 27 is connected to the through-via 6b via a wire 29 formed in the circuit fabrication region Ca3, while the electrode 28 is connected to the through-via 6c via a wire 30 formed in the circuit fabrication region Ca3.

The wire 25 is connected to the feed line formed in the wiring layer of the semiconductor chip 5, while the wire 29 is connected to the feed line formed in the wiring layer of the semiconductor chip 6. The wire 26 is connected to the reference line formed in the wiring layer of the semiconductor chip 5, while the wire 30 is connected to the reference line formed in the wiring layer of the semiconductor chip 6.

The electrode 23 of the semiconductor chip 5 is connected to the electrode 27 of the semiconductor chip 6 via a bump (serving as a first electrode connector) 31, while the electrode 24 of the semiconductor chip 5 is connected to the electrode 28 of the semiconductor chip 6 via a bump (serving as a second electrode connector) 32.

FIG. 11 shows a first example of the layout for aligning the through-vias 5a-5d and 6a-6d and the electrodes 23, 24, 27, and 28 in the paired semiconductor chips 5 and 6 whose circuit fabrication regions Ca2 and Ca3 are positioned opposite to each other.

FIG. 11 shows that the alignment of the through-vias 5a-5d and the electrodes 23 and 24 of the semiconductor chip 5 is mirror-inverse to the alignment of the through-vias 6a-6d and the electrodes 27 and 28 of the semiconductor chip 6, whereby when the semiconductor chips 5 and 6 are laminated together, the through-vias 5a-5d and the electrodes 23 and 24 are symmetrically located to overlap with the through-vias 6a-6d and the electrodes 27 and 28 in plan view.

The laminated structure adapted to the paired semiconductor chips 5 and 6 is described with reference to FIGS. 9 to 11, wherein the similar structure is adapted to the other pairs of the semiconductor chips 7 to 12 as well.

FIG. 12 shows a second example of the layout for aligning the through-vias 5a-5d and the electrodes 23 and 24 in the semiconductor chip 5, which is paired with the semiconductor chip 6 having the through-vias 6a-6d and the electrodes 27 and 28.

In the semiconductor chip 5 shown in FIG. 12, the through-via 5a, the electrode 23, and the through-via 5b are positioned in a linear symmetrical manner with the through-via 5c, the electrode 24, and the through-via 5d with respect to the center line drawn in parallel to the long side of the semiconductor chip 5.

The distance between the through-via 5a and the center line is identical to the distance between the through-via 5d and the center line. The distance between the through-via 5b and the center line is identical to the distance between the through-via 5c and the center line. The distance between the through-via 23 and the center line is identical to the distance between the through-via 24 and the center line.

The layout for aligning the through-vias 5a-5d and the electrodes 23 and 24 in the semiconductor chip 5 shown in FIG. 12 is similarly adapted to the other semiconductor chips 6 to 12, wherein the through-vias and electrodes are positioned in a linear symmetrical manner.

As shown in FIG. 10, the second embodiment locates the electrodes 23 and 27 in proximity to the through-vias 5b and 6b supplied with the drive voltage VDD while locating the electrodes 24 and 28 in proximity to the through-vias 5c and 6c supplied with the reference potential VSS. This makes it possible to reduce the lengths of the feed lines and reference lines. Thus, it is possible to reduce loop inductances, thus substantially reduce feed noises.

It is apparent that the present invention is not limited to the above embodiments, but may be modified and changed without departing from the scope and spirit of the invention and within the scope of the invention as defined by the appended claims.

Both the first and second embodiments are designed such that the semiconductor chips 5 to 12 serve as dynamic random-access memories (DRAM); but this is not a restriction. It is possible to use nonvolatile memories such as flash memories and other semiconductor chips not serving as semiconductor memories.

Both the first and second embodiments are designed such that the semiconductor chip 4 serves as the controller for controlling the paired semiconductor chips 5 to 12; but this is not a restriction. For example, the semiconductor device of the present invention can be configured using even-numbered pairs of semiconductor chips only.

In terms of the industrial applicability, the present invention is well suited to semiconductor devices having chip-on-chip structures.

What is claimed is:

1. A semiconductor device comprising:
a first semiconductor device including a first semiconductor chip and a second semiconductor chip, which are stacked and each of which includes a first power electrode formed on a first surface as well as a second power electrode and a third power electrode, electrically connected inside the first power electrode, formed on a second surface, said first semiconductor device further including a first conductor which is formed between the second power electrode of the first semiconductor chip and the second power electrode of the second semiconductor chip, which are positioned opposite to each other, and between the third power electrode of the first semiconductor chip and the third power electrode of the second semiconductor chip, which are positioned opposite to each other; and
a second semiconductor device, having the same configuration as the first semiconductor device and stacked with the first semiconductor device, said second semiconductor device further including a second conductor which connects between the first power electrode of the second semiconductor chip of the first semiconductor device and the first power electrode of the second semiconductor device, which are positioned opposite to each other, wherein the first and second semiconductor chips are exclusively controlled, such that the first semiconductor chip is disabled if the second semiconductor chip is enabled and the second semiconductor chip is disabled if the first semiconductor chip is enabled.

2. The semiconductor device according to claim 1, wherein each of the first and second semiconductor chips is configured of a semiconductor memory.

3. The semiconductor device according to claim 1 further comprising a third semiconductor chip which is connected to the first and second semiconductor devices, as stacked together.

4. The semiconductor device according to claim 3, wherein the third semiconductor chip comprises a controller chip which exclusively controls the first and second semiconductor chips, using an inverter circuit that alternately enables the first and second semiconductor chips.

5. The semiconductor device according to claim 4 further comprising a substrate for mounting the first and second pairing semiconductor chips, as stacked together, and the controller chip.

6. The semiconductor device according to claim 1, wherein the first power electrode and the third power electrode of the first semiconductor chip are connected via a through-electrode running through the first semiconductor chip in a thickness direction, and wherein the first power electrode and the third power electrode of the second semiconductor chip are connected via a through-electrode running through the second semiconductor chip in its thickness direction.

7. The semiconductor device according to claim 1, wherein the first and second semiconductor chips are each equipped with a plurality of signal terminals for sending and receiving signals.

8. A semiconductor device comprising:
a first semiconductor device including a first semiconductor chip and a second semiconductor chip, which are stacked, and each of which includes a first power electrode and a second power electrode formed on a first surface as well as a third power electrode, electrically connected to the first power electrode, and a fourth power electrode, electrically connected to the second power electrode, formed on a second surface, said first semiconductor device further including a first conductor which is formed between the third power electrode of the first semiconductor chip and the first power electrode of the second semiconductor chip, which are positioned opposite to each other, and between the fourth power electrode of the first semiconductor chip and the second power electrode of the second semiconductor chip, which are positioned opposite to each other; and
a second semiconductor device having a same configuration as the first semiconductor device and stacked with the first semiconductor device, said second semiconductor device further including a second conductor which connects between the third power electrode of the second semiconductor chip of the first semiconductor device and the first power electrode of the second semiconductor device, which are positioned opposite to each other, wherein no conductor is formed between the fourth power electrode of the second semiconductor chip of the first semiconductor device and the second power electrode of the first semiconductor chip of the second semiconductor device, which are positioned opposite to each other.

9. The semiconductor device according to claim 8, wherein each of the first and second semiconductor chips is configured of a semiconductor memory.

10. The semiconductor device according to claim 8 further comprising a third semiconductor chip which is connected to the first and second semiconductor devices stacked together.

11. The semiconductor device according to claim 10, wherein the third semiconductor chip comprises a controller chip which exclusively controls the first and second semiconductor chips.

12. The semiconductor device according to claim 11 further comprising a substrate for mounting the first and second semiconductor devices, stacked together, and the controller chip.

13. The semiconductor device according to claim 8, wherein the first power electrode and the third power electrode of the first semiconductor chip as well as the second power electrode and the fourth power electrode of the first semiconductor chip are each connected via a through-electrode running through the first semiconductor chip in a thickness direction, and wherein the first power electrode and the third power electrode of the second semiconductor chip as well as the second power electrode and the fourth power electrode of the second semiconductor chip are each connected via a through-electrode running through the second semiconductor chip in its thickness direction.

14. The semiconductor device according to claim 8, wherein the first and second semiconductor chips are each equipped with a plurality of signal terminals for sending and receiving signals.

15. A semiconductor device comprising:
a first semiconductor device including a first semiconductor chip and a second semiconductor chip, each of which includes a first power voltage electrode, a second power voltage electrode independently of the first power voltage electrode, a first reference voltage electrode, and a second reference voltage electrode independently of the first reference voltage electrode, which are formed on a first surface, as well as a third power voltage electrode electrically connected to the first power voltage electrode, a fourth power voltage electrode, independently of the third power voltage electrode, electrically connected to the second power voltage electrode, a third reference voltage electrode electrically connected to the first power voltage electrode, and a fourth reference voltage electrode, independently of the third reference voltage electrode, electrically connected to the second reference voltage electrode, which are formed on a second surface, said first semiconductor device further including a first conductor which is formed between the third power voltage electrode of the first semiconductor chip and the first power voltage electrode of the second semiconductor chip, positioned opposite to each other, between the fourth power voltage electrode of the first semiconductor chip and the second power voltage electrode of the second semiconductor chip, positioned opposite to each other, between the third reference voltage electrode of the first semiconductor chip and the first reference voltage electrode of the second semiconductor chip, positioned opposite to each other, and between the fourth reference voltage electrode of the first semiconductor chip and the second reference voltage electrode of the second semiconductor chip, positioned opposite to each other; and a second semiconductor device having a same configuration as the first semiconductor device and stacked with the first semiconductor device, said second semiconductor device further including a second conductor which connects between the third power voltage electrode of the second semiconductor chip of the first semiconductor device and the first power voltage electrode of the first semiconductor chip of the second semiconductor device, positioned opposite to each other, and between the third reference voltage electrode of the second semiconductor chip of the first semiconductor device and the first reference voltage electrode of the first semiconductor chip of the second semiconductor device, positioned opposite to each other, wherein no conductor is formed between the fourth power voltage electrode of the second semiconductor chip of the first semiconductor device and the second power voltage electrode of the first semiconductor chip of the second semiconductor device, positioned opposite to each other, and between the fourth reference voltage electrode of the second semiconductor chip of the first semiconductor device and the second reference voltage electrode of the first semiconductor chip of the second semiconductor device.

16. The semiconductor device according to claim 15, wherein each of the first and second semiconductor chips is configured of a semiconductor memory.

17. The semiconductor device according to claim 15 further comprising a third semiconductor chip which is connected to the first and second semiconductor devices stacked together.

18. The semiconductor device according to claim 17, wherein the third semiconductor chip comprises a controller chip which exclusively controls the first and second semiconductor chips.

19. The semiconductor device according to claim 18 further comprising a substrate for mounting the first and second semiconductor devices, stacked together, and the controller chip.

20. The semiconductor device according to claim 15, wherein the first power voltage electrode and the third power voltage electrode of the first semiconductor chip, the second power voltage electrode and the fourth power voltage electrode of the first semiconductor chip, the first reference voltage electrode and the third reference voltage electrode of the first semiconductor chip, and the second reference voltage electrode and the fourth reference voltage electrode of the first semiconductor chip are each connected via a through-electrode running through the first semiconductor chip in its thickness direction, and wherein the first power voltage electrode and the third power voltage electrode of the second semiconductor chip, the second power voltage electrode and the fourth power voltage electrode of the second semiconductor chip, the first reference voltage electrode and the third reference voltage electrode of the second semiconductor chip, and the second reference voltage electrode and the fourth reference voltage electrode of the second semiconductor chip are each connected via a through-electrode running through the second semiconductor chip in its thickness direction.

21. The semiconductor device according to claim 15, wherein the first and second semiconductor chips are each equipped with a plurality of signal terminals for sending and receiving signals.

* * * * *